(12) United States Patent
Chan et al.

(10) Patent No.: US 6,822,875 B2
(45) Date of Patent: Nov. 23, 2004

(54) ASSEMBLY OF OPTO-ELECTRONIC MODULE WITH IMPROVED HEAT SINK

(75) Inventors: Benson Chan, Vestal, NY (US); Paul Francis Fortier, Richelieu (CA); Ladd William Freitag, Rochester, MN (US); Gary T. Galli, Binghampton, NY (US); Francois Guindon, Stukely-sud (CA); Glen Walden Johnson, Yorktown Heights, NY (US); Martial Letourneau, Granby (CA); John H. Sherman, Lisle, NY (US); Real Tetreault, Granby (CA)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/281,036

(22) Filed: Oct. 24, 2002

(65) Prior Publication Data

US 2003/0059176 A1 Mar. 27, 2003

Related U.S. Application Data

(62) Division of application No. 09/569,029, filed on May 11, 2000, now Pat. No. 6,508,595.

(51) Int. Cl.[7] ................................................ H05K 7/10
(52) U.S. Cl. ...................... 361/760; 361/777; 361/736; 361/720; 361/803; 211/41.17; 174/259; 174/52.4
(58) Field of Search ................................ 361/760, 777, 361/709, 712, 713, 701, 803, 720, 736, 748, 767; 174/259, 52.4; 211/41.17

(56) References Cited

U.S. PATENT DOCUMENTS

| | | | |
|---|---|---|---|
| 5,121,457 A | | 6/1992 | Foley et al. |
| 5,153,449 A | * | 10/1992 | Crook et al. .................. 307/66 |
| 5,420,954 A | | 5/1995 | Swirhun et al. |
| 5,432,630 A | | 7/1995 | Lebby et al. |
| 5,631,988 A | | 5/1997 | Swirhun et al. |
| 5,768,456 A | | 6/1998 | Knapp et al. |
| 5,774,614 A | | 6/1998 | Gilliland et al. |
| 5,781,682 A | | 7/1998 | Cohen et al. |
| 5,818,994 A | | 10/1998 | Hehmann |
| 5,832,150 A | | 11/1998 | Flint |
| 6,064,116 A | * | 5/2000 | Akram ........................ 257/723 |
| 6,538,898 B1 | * | 3/2003 | Prindivill et al. ........... 361/760 |

FOREIGN PATENT DOCUMENTS

| | | | |
|---|---|---|---|
| DE | 0 883 192 A2 | * 12/1998 | |
| JP | 04-137072 | 12/1992 | ....... H01L/31/0232 |
| JP | 05-003330 | 1/1993 | ........... H01L/31/02 |
| JP | 05-175545 | 7/1993 | ........... H01L/31/14 |

(List continued on next page.)

OTHER PUBLICATIONS

Chuang et al., Integrated circuit Package with Heatsink support, Pub: US 2004/0036162 A1; Feb. 26, 2004.*
Cohen, M.S., et al., "Packaging Aspects of the Jitney Parallel Optical Interconnect," *1998 Electronic Components and Technology Conference*, pp. 1206–1215.
Crow, J.D., et al., "The Jitney Parallel Optical Interconnect," *1996 Electronic Components and Technology Conference*, pp. 292–300.

(List continued on next page.)

*Primary Examiner*—Hung S. Bui
(74) *Attorney, Agent, or Firm*—Arthur J. Samodovitz

(57) ABSTRACT

A heat sink for a transceiver optoelectronic module including dual direct heat paths and a structure which encloses a number of chips having a central web which electrically isolates transmitter and receiver chips from each other. A retainer for an optical coupler having a port into which epoxy is poured. An overmolded base for an optoelectronic module having epoxy flow controller members built thereon. Assembly methods for an optoelectronic module including gap setting and variation of a TAB bonding process.

2 Claims, 11 Drawing Sheets

FOREIGN PATENT DOCUMENTS

| | | | |
|---|---|---|---|
| JP | 05-215943 | 8/1993 | ............ G02B/6/42 |
| JP | 07/244229 | 9/1995 | ............ G02B/6/42 |
| JP | 07-294783 | 11/1995 | ............ G02B/6/42 |
| JP | 08-172220 | 7/1996 | |
| JP | 08-220386 | 8/1996 | ............ G02B/6/42 |
| JP | 09-214065 | 8/1997 | ............. H01S/3/18 |
| JP | 10-041580 | 2/1998 | ............. H01S/3/18 |
| JP | 10-115734 | 5/1998 | ............ G02B/6/42 |
| JP | 11-068254 | 3/1999 | ............. H01S/3/18 |
| JP | 11-202163 | 7/1999 | ............ G02B/6/42 |
| JP | 11-264920 | 9/1999 | ............ G02B/6/42 |
| JP | 11-266035 | 9/1999 | ........... H01L/33/00 |
| JP | 11/297427 | 10/1999 | ........... H01R/23/02 |

OTHER PUBLICATIONS

Karstensen, H., et al., "Parallel Opitcal Link (PAROLI) for Multichannel Gigabit Rate Interconnection," *1998 Electronic Components and Technology Conference*, pp. 747–754.

Katsura, K., et al., "Packaging for a 40–Channel Parallel Optical Interconnection Module with an over 25–Gb/s Throughput," *1998 Electronic Components and Technology Conference*, pp. 755–761.

Hahn, K. H., et al., "Gigabyte/s Data Communications with the POLO Parallel Optical Link," *1996 Electronic Components and Technology Conference*, pp. 301–307.

Miura, A., et al., "Reliable, Compact, CMOS Interface, 200–Mbit/s x 12–Channel Optical Interconnects Using Single–Mode Fiber Arrays", *1997 Electronic Components and Technology Conference*, pp. 225–230.

Takai, A., et al., "200–Mb/s/ch 100–m Optical Subsystem Interconnections Using 8–Channel 1.3–$\mu$m Laser Diode Arrays and Single–Mode Fiber Arrays," *Journal of Lightwave Technology*, vol. 12, No. 2, Feb. 1994, pp. 260–270.

Tanaka, N., et al., "3.5 Gb/s x 4 ch Optical Interconnection Module for ATM Switching System," *1997 Electronic Components and Technology Conference*, pp. 210–216.

Nagahori, T., et al., "1–Gbyte/sec Array Transmitter and Receiver Modules for Low–Cost Optical Fiber Interconnection," *1996 Electronic Components and Technology Conference*, pp. 255–258.

Liu, Y.S., et al., "Plastic VCSEL Array Packaging and High Density Polymer Waveguides for Board and Backplane Optical Interconnect," *1998 Electronic Components and Technology Conference*, pp. 999–1005.

Wong, Y.M., et al., "OptoElectronic Technology Consortium (OETC) Parallel Optical Data Link: Components, System Applications, and Simulation Tools," *1996 Electronic Components and Technology Conference*, pp. 269–278.

Rosenberg, P., et al., "The PONI–1 Parallel–Optical Link," *1996 Electronic Components and Technology Conference*, pp. 763–769.

Lebby, M., et al., "Characteristics of VCSEL Arrays for Parallel Optical Interconnects," *1996 Electronic Components and Technology Conference*, pp. 279–291.

Norton, L.J., et al., "OPTOBUS™I: A Production Parallel Fiber Optical Interconnect," *1997 Electronic Components and Technology Conference*, pp. 204–209.

\* cited by examiner

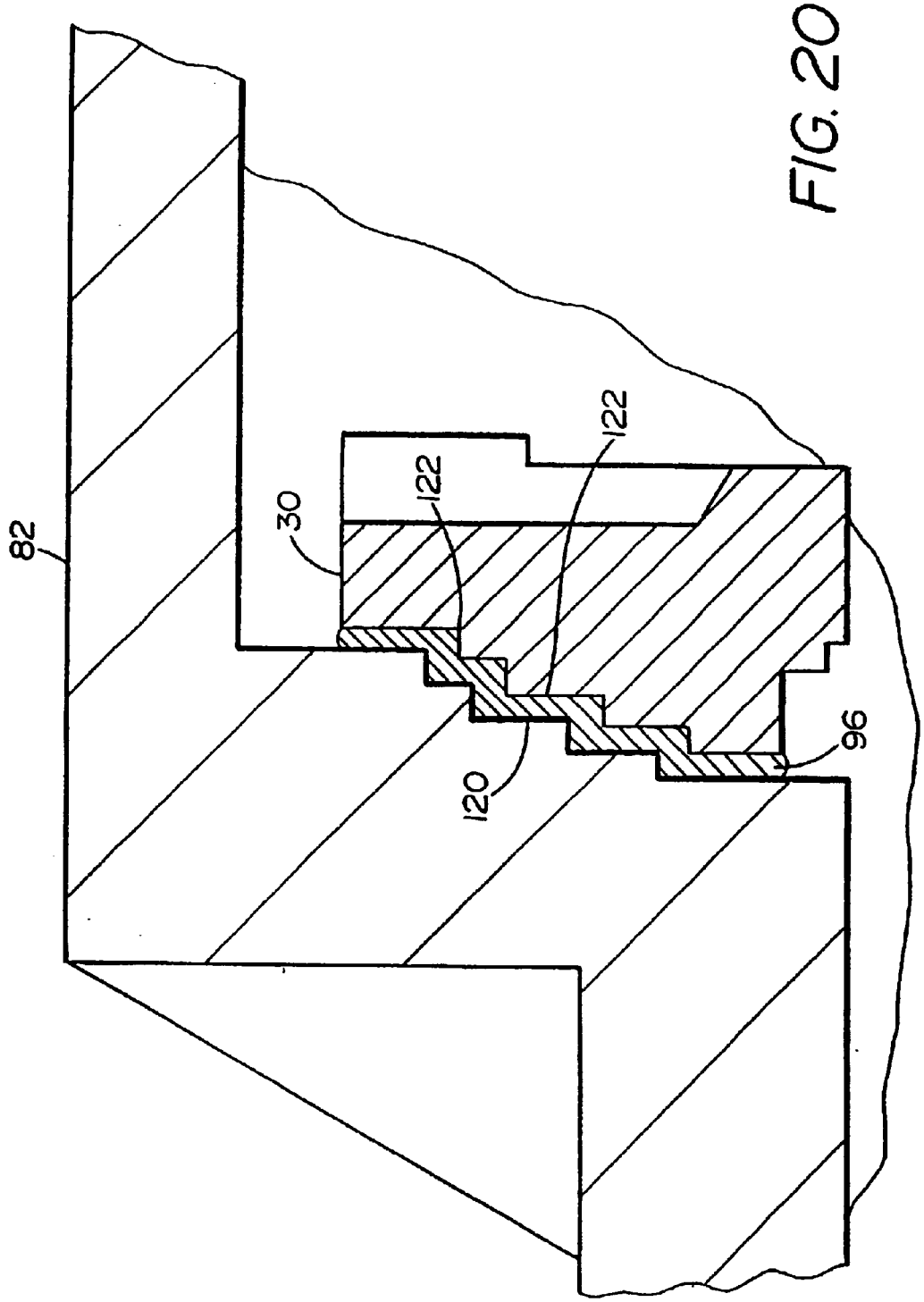

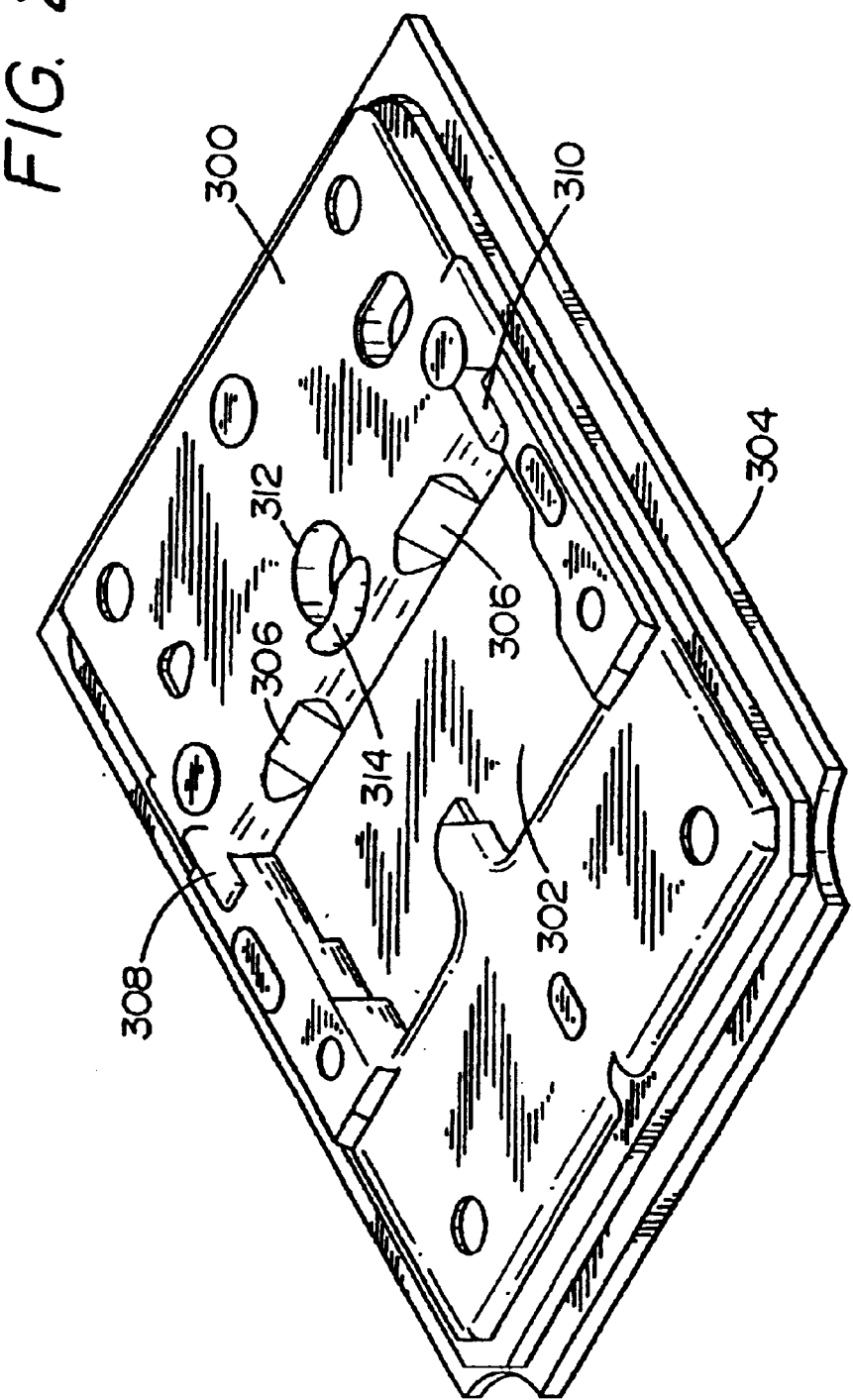

ASSEMBLY OF OPTO-ELECTRONIC MODULE WITH IMPROVED HEAT SINK

CROSS REFERENCE TO CO-PENDING APPLICATIONS

This application is a divisional of Ser. No. 09/569,029, filed May 11, 2000 now U.S. Pat. No. 6,508,595.

GOVERNMENT RIGHTS

This invention was made with Government support under subcontract B338307 under prime contract W-7405-END-48 awarded by the Department of Energy. The Govenment has certain rights in this invention.

TECHNICAL FIELD

The present invention relates to opto-electronic transceiver modules and, more particularly, to structures of and methods of making subassemblies in a module for coupling a multiple channel fiber optic cable to a multiple channel transmitter comprising a Vertical Cavity Surface Emitting Laser (VCSEL) transmitter and to a multiple channel receiver comprising a photodetector and a transimpedance amplifier commonly referred to as a Preamplifier with Integrated Detector (PAID).

BACKGROUND OF THE INVENTION

An opto-electronic transceiver is the key component in a parallel fiber optic data link. One such transceiver is a modular package or module for coupling a multiple channel fiber optic cable to a multiple channel Vertical Cavity Surface Emitting Laser (VCSEL) and to a multiple channel receiver. The module consists of various components, including both CMOS and opto-electronic dies (chips). It is designed to accept a single connector that has one receive and one transmit section and is mounted on the end of a dual 12-channel fiber optic ribbon cable. The transit half of the module converts parallel electrical input signals into their corresponding parallel optical output signals through a laser driver and a Vertical Cavity Surface Emitting Laser (VCSEL) diode array. The receive half of the module converts parallel optical input signals into corresponding parallel electrical output signals by using an array of photodetectors and transimpedance amplifiers to convert the optical input signals to voltage signals. This arrangement of photodetector and amplifier is commonly referred to as a "PAID" (Preamplifier with Integrated Detector). The module also includes driver chips which communicate data signals to the transmitter and receiver chips.

The optoelectronic transceiver module comprises a number of major building blocks. One is an overmolded laminate subassembly that incorporates electronic functions using standard manufacturing materials. The second is a retainer subassembly that incorporates optical and other components necessary to support the module's optoelectronic, optical and connector functions. The retainer subassembly includes both a receiver optical subassembly (ROSA) and a transmitter optical subassembly (TOSA). The module is assembled by mounting the retainer subassembly on the overmolded laminate subassembly and electrically connecting the two subassemblies. A heat sink is a third major component since it is important to efficiently remove heat which is generated by all chips. An EMI (electromagnetic Interference) shield is also attached.

Although the driver chips are buried in the overmold, and lie substantially perpendicularly to the transmitter and receiver chips, the heat sink must function to remove heat from all chips. Additionally, the transmitter and receiver chips are located in proximity to each other, but cross-talk therebetween must be avoided. Finally, an assembly methodology must be used which is repeatable, reliable, and meets the required assembly tolerances.

SUMMARY OF THE INVENTION

In accordance with the present invention, an optoelectronic module is provided having the following advantages:

a) Improved removal of heat from the optoelectronic chips, b) Elimination of cross-talk between chips using simplified structure, c) Simplified and reliable assembly methodology, and d) Package size reduction.

In accordance with an aspect of the invention, in an electronic module including an optical coupler and a plurality of chips, each of which is located in a mount, wherein two such mounts lie in a common plane and a third mount lies in a substantially perpendicular plane to the common plane, an improved heat sink is provided comprising first and second metallic surfaces which are parallel to the common plane and which overlie the area occupied by first and second chips, and a third metallic surface which is substantially parallel to the perpendicular plane and which overlies the area occupied by other chips.

In accordance with further aspects of the invention, improved retainers for optical couplers are provided as are improved chip carriers and overmolds, as well as improved methods of securing the optical retainer in the coupler, and of bonding flexible leads to the chip carrier.

DESCRIPTION OF THE DRAWINGS

FIG. 20 is a sectional view of an embodiment having stepped surfaces on the carrier and heat sink; and FIG. 21 is a perspective view of an overmold, showing numerous epoxy flow control members.

DETAILED DESCRIPTION OF THE PREFERRED EMBODIMENTS

Figure 1:
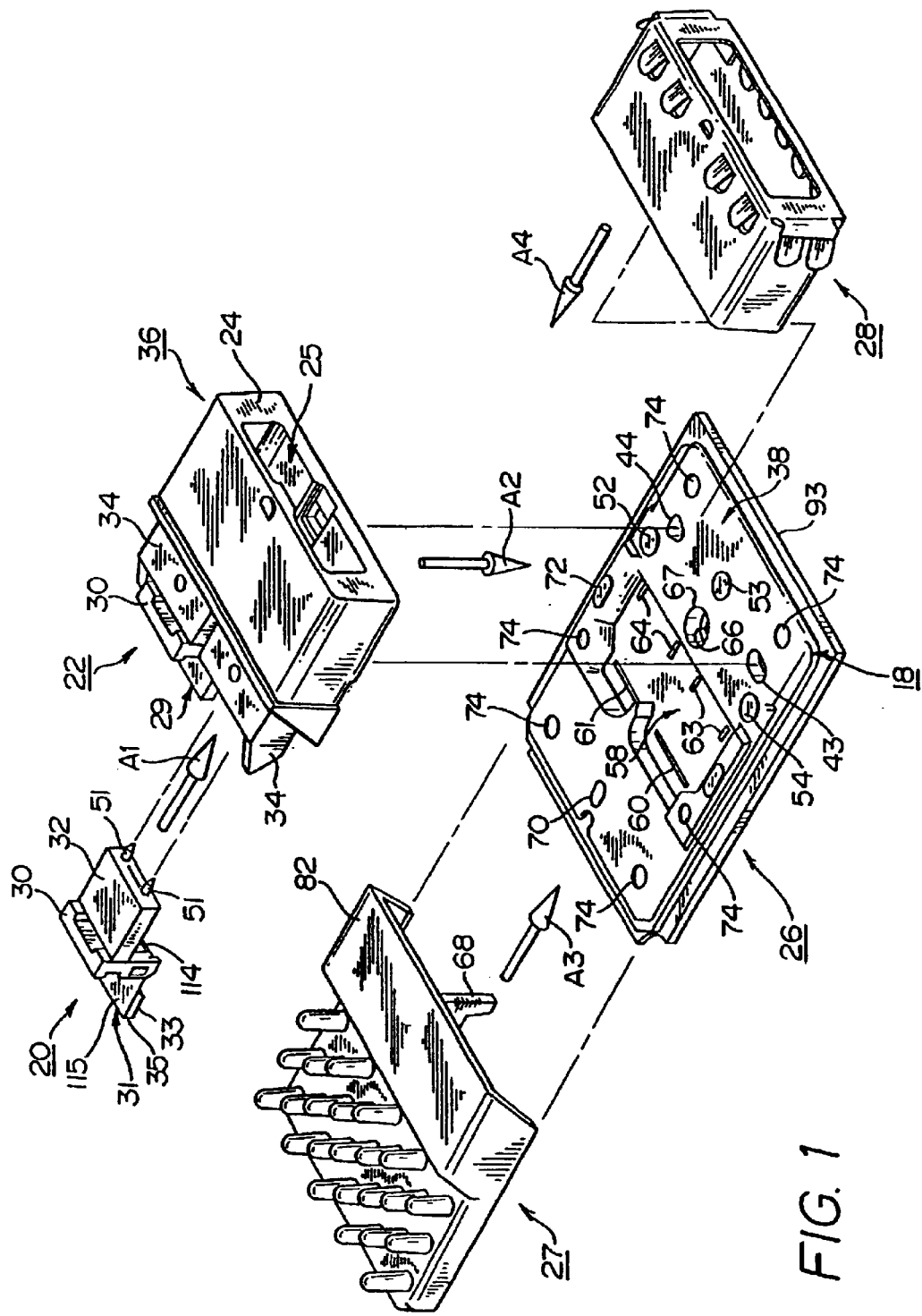
FIG. 1 is an exploded assembly drawing of the optoelectronic module of the invention.

Referring now to FIG. 1 of the drawings, there is shown an exploded view of a parallel optoelectronic module having a receiver optic assembly 20, a transmitter optic assembly 22, a retainer 24, an overmold assembly 26, a heat sink 27, and an EMI (Electromagnetic Interference) shield 28. The overmold assembly 26 comprises an overmold frame 18 of electrically insulating material on a laminate board 93. Each optic assembly includes a die carrier 30, a flexible circuit (flex 29, 31), and an optical coupler 32, and is received and held in a corresponding receptacle portion 34 including a cavity, forming part of a retainer 24. An optoelectronic die is also mounted on the die carrier 30, which also includes two passages for mating with forward alignment pins (not shown) of optical coupler 32, the forward alignment pins being similar to rear alignment pins 51 for engaging corresponding passages in the receptacle portion 34 formed as an integral part of retainer 24. The flex 31 is used for electrically connecting multiple pads 60, 61 on the laminate (board) surface to pads on the optoelectronic dies.

The module is assembled by first inserting the two optic assemblies 20 and 22 into the retainer 24, as indicated by arrow A1, then placing the resulting retainer assembly 36 on a supporting platform 38 of the overmold by fitting alignment posts on the bottom of the retainer (not shown) into a corresponding trilobe hole 44 and slot hole 43 in the overmold platform 38, and applying adhesive to secure the two components together.

The retaining sub-assembly allows a high degree of assembly accuracy by using a fixture. This allows the two optical couplers and the retainer to be suitably assembled without requiring stringent tolerances. The triobular hole and slot allow the adhesive to be vented when placing the retainer subassembly in position, plus this combination allows a zero assembly clearance without requiring a high insertion force (line contacts instead of circular interfaces). Exposed on the laminate surface in the cavity 58 are two grounding pads 63, 63 for the die carrier 30 of the receiver assembly, and two grounding pads 64, 64 for the die carrier of the transmitter optic assembly 22. The laminate 93 also includes a grounding pad 66 exposed at the bottom of an overmold well 67 for grounding a web 68 projecting downwardly from the heat sink 27. The overmold frame 18 also includes three additional standoff pads 70, 71, and 72 arranged to cooperate with corresponding standoff pads on the underside of the heat sink 27. The overmold frame may further include circular areas 74 formed by mold ejection pins for freeing the overmold assembly from the molding apparatus upon completion of the molding operation.

Figure 2:
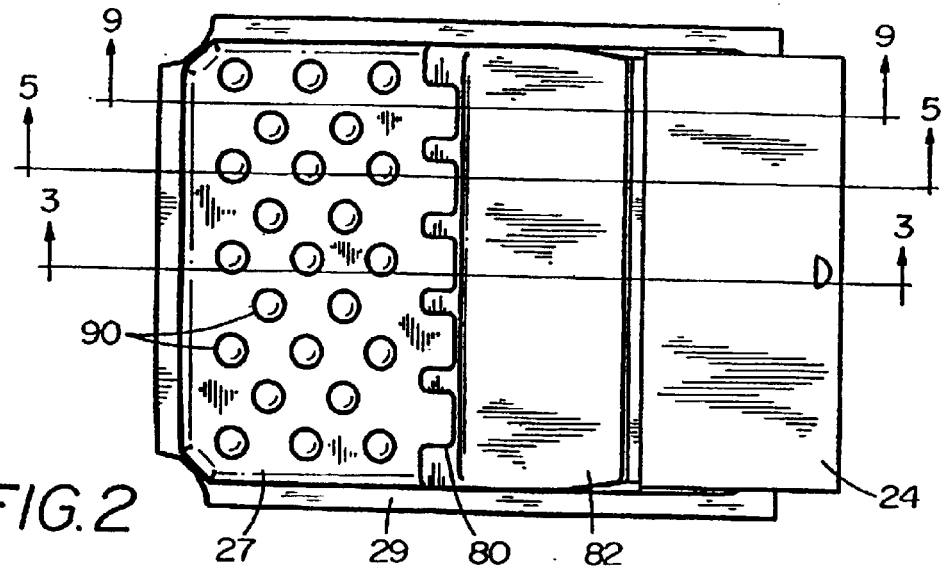
FIG. 2 is a top view of the module of the invention.
Figure 10:
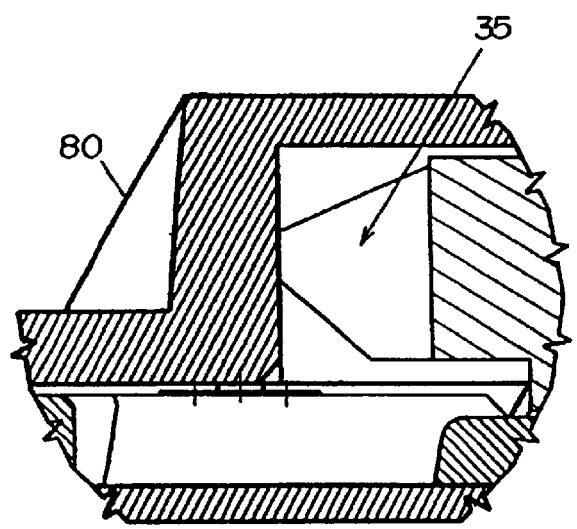
FIG. 10 is a sectional view of Detail J of FIG. 9.
Figure 11:
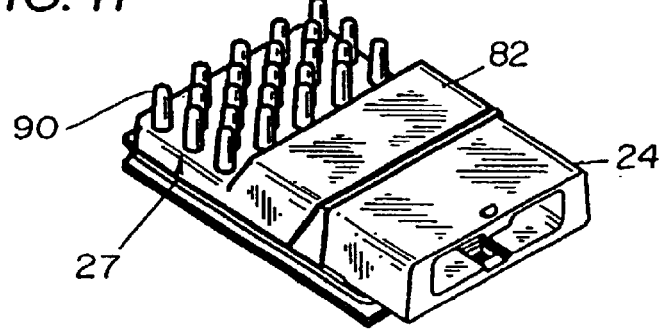
FIG. 11 is a perspective view of the assembled article of FIG. 1.
Figure 12:
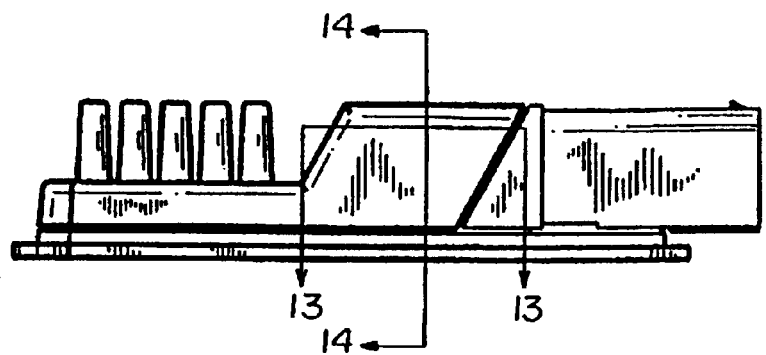
FIG. 12 is a side view of the packaging article of the invention.

The heat sink of the invention is shown in perspective in FIGS. 1 and 11. It includes pin fins 90 (heat exchanging surfaces) on a horizontal platform, top 82 which partially covers the retainer, and central web 68. It also includes angled surface 80 having a scalloped edge, which also acts as a heat exchanging surface (FIGS. 2, 10). It is made of various metals, e.g., nickel coated aluminum.

Figure 5:
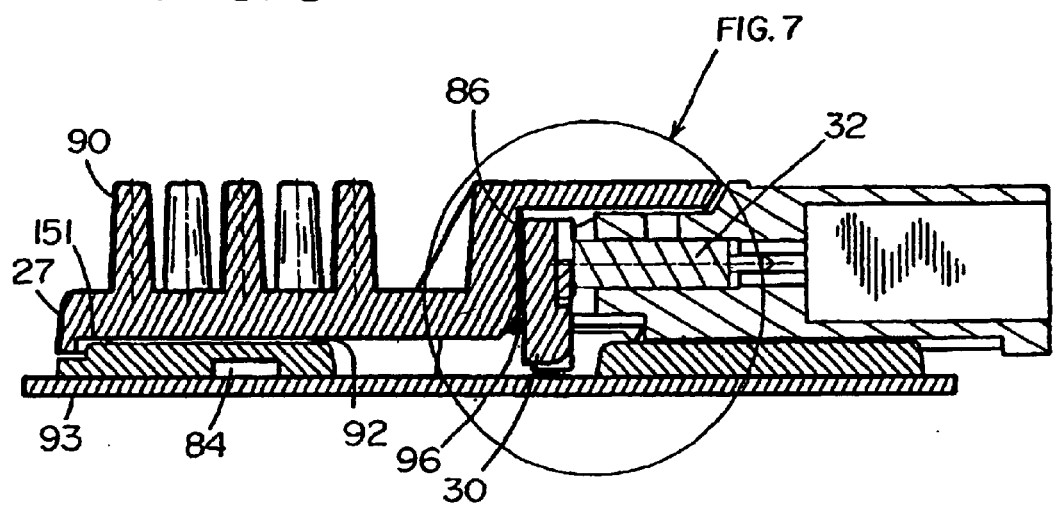
FIG. 5 is a sectional view of Section B—B of FIG. 1.
Figure 7:
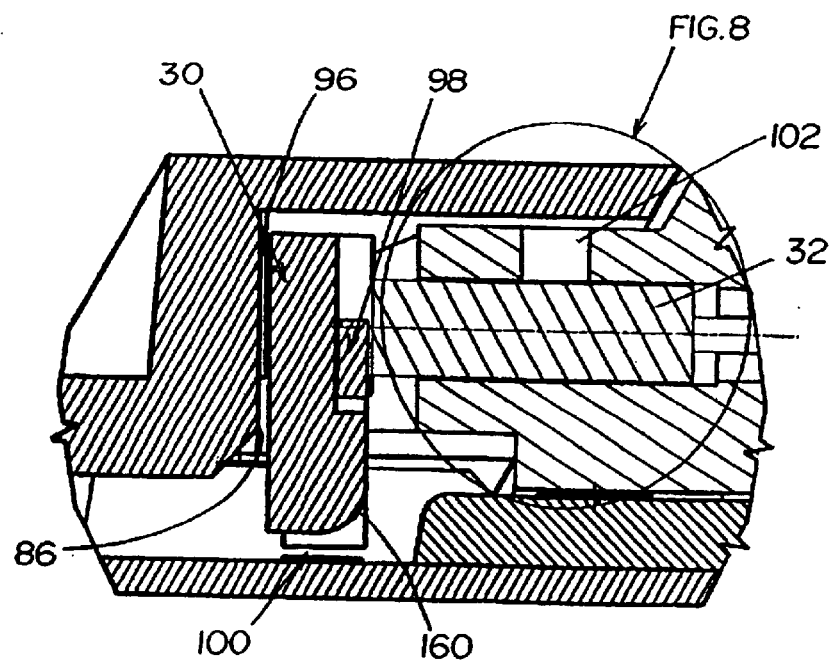
FIG. 7 is a sectional view of Detail G of FIG. 5.
Figure 13:
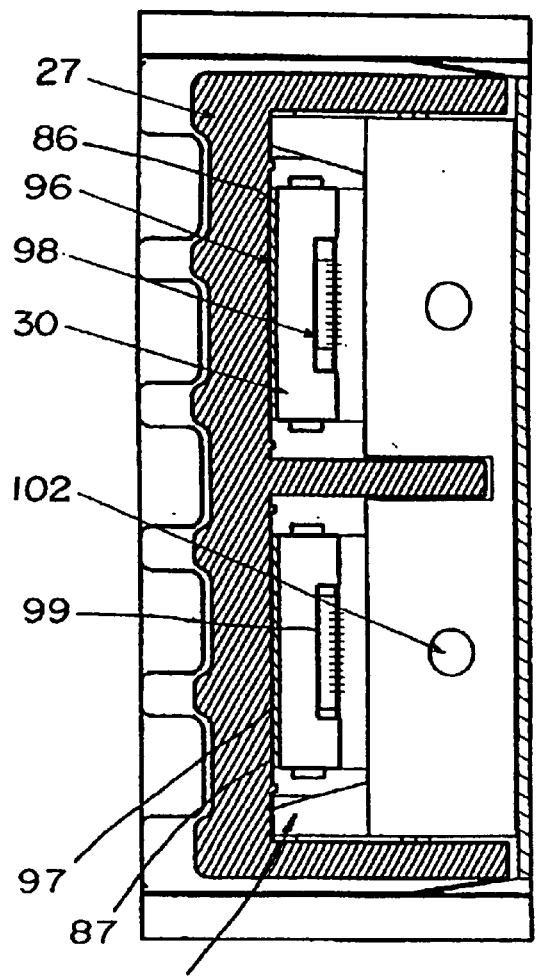
FIG. 13 is a sectional view of Section D—D of FIG. 12.

FIG. 5 which is section B—B of FIG. 2, illustrates how the novel heat sink provides direct dual heat escape paths. The first path is from the chip carrier 30 across gap 96 and out through the metallic components of the heat sink. Referring to FIG. 7, Detail G, the first heat sink surface encountered by the heat flowing across gap 96 is metallic surface 86, which is substantially parallel to the common planes in which the parallel rear surfaces of the chip carriers lie. FIG. 13 illustrates the twin gaps 96 and 97 associated with the two chips and with first and second heat sink metallic surfaces 86 and 87.

Referring to FIG. 5, it is noted that driver chips 84 are buried in the overmold. The purpose of the driver chips is to communicate control signals via the laminate card 93 to the transmitter and receiver chips. The second heat path is from the overmold across gap 92 to parallel heat sink metallic surface 151 and out through pin fins 90. Gaps 96 and 92 are filled with heat conductive epoxy, and the width of these gaps must be closely controlled for proper operation. Thus, if the gaps are too wide, efficient heat transfer will not occur, while if the gaps are too narrow, unintentional electrical contact may result in some places. The purpose of the epoxy is to promote more efficient heat flow, by avoiding the inevitable discontinuities which would result if the surfaces were simply pressed into contact with each other. In the present structure, direct heat paths are provided and the shared area may be optimized. In the preferred embodiment of the particular device depicted, the width of gap 96 was about 100 to 300 microns, while the width of gap 92 was about 150 to 400 microns, it being understood that other dimensions may be applicable to other specific devices. It should be understood that heat from the driver chips 84 will also flow into the laminate board and into balls of a ball grid array (BGA) (not shown) and on into a host card (not shown).

Figure 4:
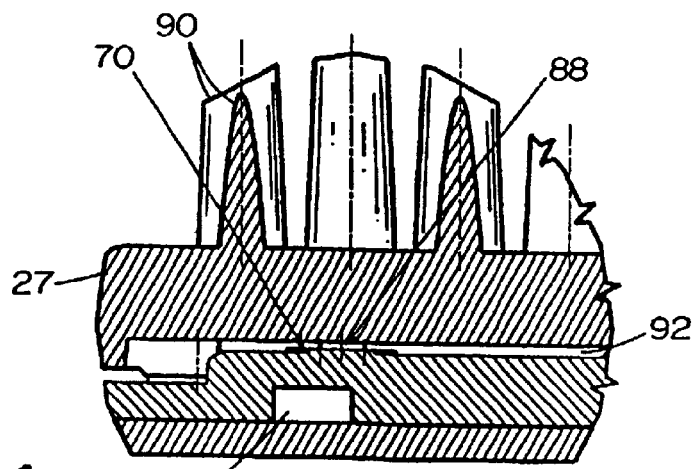
FIG. 4 is a sectional view of Detail E of FIG. 3.

FIG. 4, Detail E, shows how the gap 92 is maintained. There are 3 pads 70, 71 and 72 on the top of the overmold (FIG. 1), three points defining a plane, and corresponding pads 88 on the bottom of the heat sink. The pads are features molded into the individual parts. The overmold pads are used to locate the heat sink pads and the heat sink pads are then slid over the overmold pads into the proper position using the elongated overmold pads as a guide. Thus, in the final position, the heat sink pads remain in overlying contact with the overmold pads (FIG. 4). The shared pad feature allows three point contact, thereby improving the relevant disposition of one part to its mating part. Furthermore, inspecting the quality of the parts is restricted to the pad area. In the assembled device, the attachment adhesive used between the heat sink and the mold is somewhat compliant. This allows the relative motion of the two parts under changing temperature conditions.

The overmold also has pads 52, 53 and 54 (FIG. 1) disposed in alignment with corresponding pads on retainer 24. The use of two sets of three pads with defined repeatable standoffs accomplishes the desired control of gap thickness. The three point contact provides increased control for functional relationships yet allows some forgiveness with regard to the detail part. This also provides a highly inspectable assembly with well defined planes.

Figure 3:
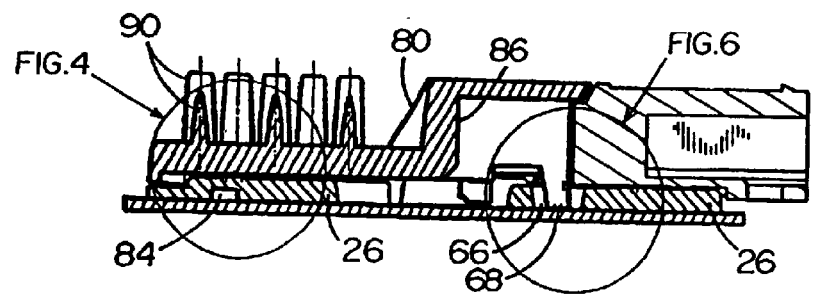
FIG. 3 is a sectional view of section A—A of FIG. 2.
Figure 6:
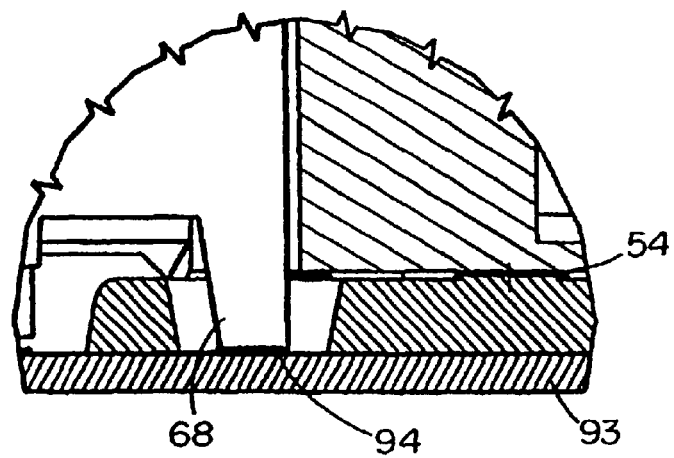
FIG. 6 is a sectional view of Detail F of FIG. 3.
Figure 14:
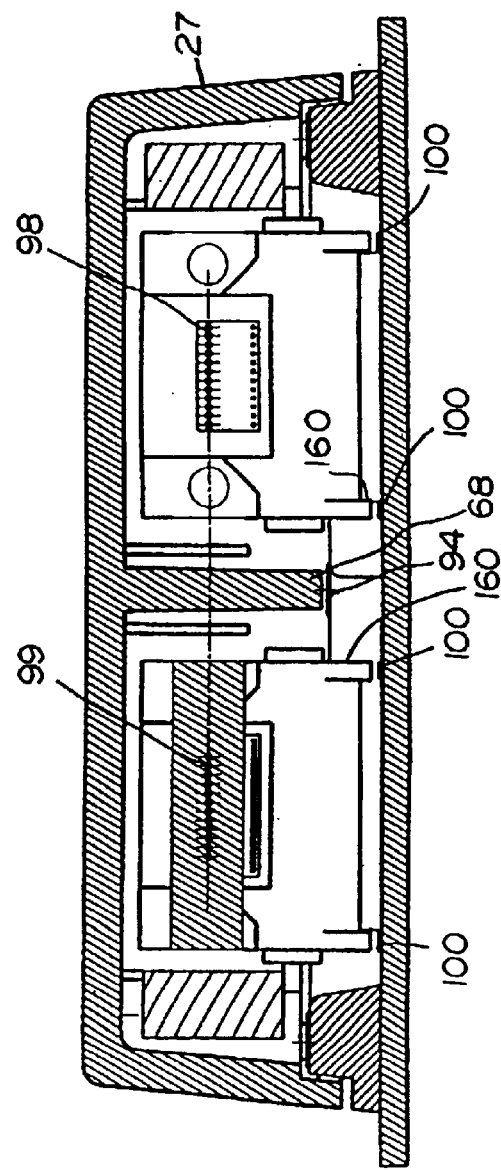
FIG. 14 is a sectional view of section C—C of FIG. 12.

A feature of the invention is that the heat sink encloses both of the transmitter and receiver chips and separates them, thus, eliminating cross-talk. Referring to FIGS. 1,3 and 6, it is seen that the heat sink has a central web 68 having a web foot which extends into well 67 in the overmold. Referring to FIGS. 13 and 14, it is seen that there is a space between the chips and retainer cavities through which the metallic web extends, electrically isolating the chips from each other. Referring to FIG. 6, it is seen that the web foot is grounded to a conductive pad on card 93 by means of conductive epoxy 94 (FIG. 14), the thickness of which controls the grounding gap. As seen in FIGS. 7 and 14, the bottom portions 160 of the carriers are also grounded to pads 63 and 64 of the card in cavity 58 (FIG. 1) by the use of conductive epoxy.

Figure 8:
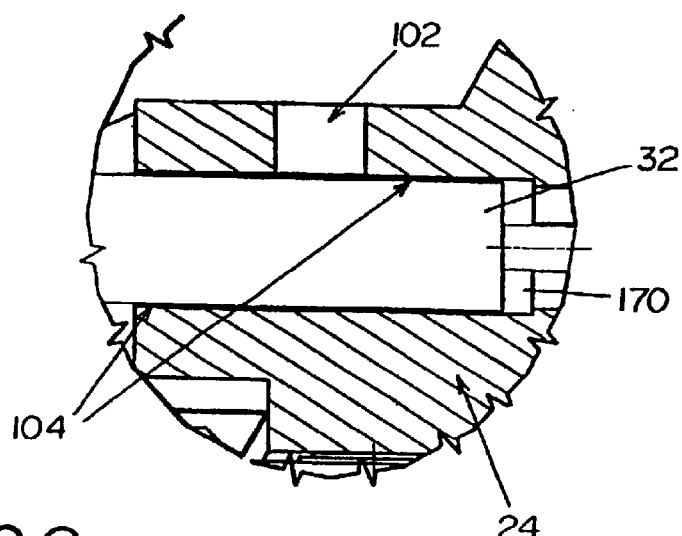
FIG. 8 is a sectional view of Detail H of FIG. 7.
Figure 9:
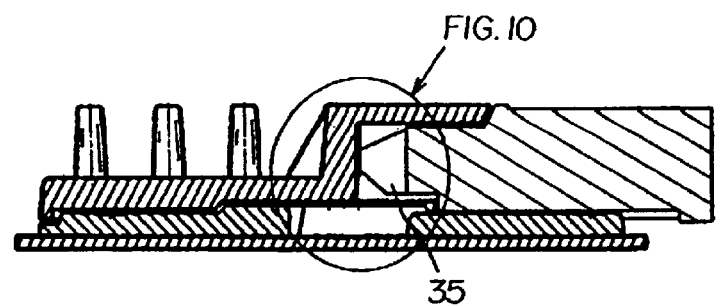
FIG. 9 is a sectional view of Section I—I of FIG. 2.

Referring to FIGS. 7 and 8, it is noted that the retainer has a cavity 170 for each optical coupler, which is oversized in relation to the optical coupler. Each cavity also has a port 102 into which epoxy may be poured to secure the optical coupler.

Figure 15:
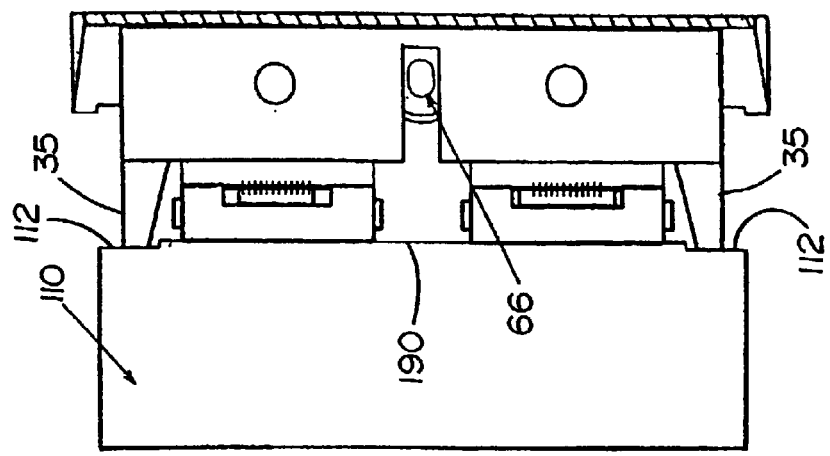
FIG. 15 is a plane view showing the gap setting tool.

It will now be described how the gap between the chip carrier and the heat sink is obtained. Referring to FIG. 15, it is seen that the retainer has stand offs 35 projecting therefrom. A gap setting tool 110 is used to set the gap with the optical coupler in the correct position. As can be seen, gap setting tool 110 has an elongated flat surface 190, but at each end has a recess 112, the depth of which determines the width of the gap. The recesses are set against the stand offs, the optical couplers are pushed all the way into the cavities, but an opposite force is applied pushing them out until they are flush with surface 190 of the gap setting tool. It is when this position is attained that the optical coupler is secured in position.

Figure 16:
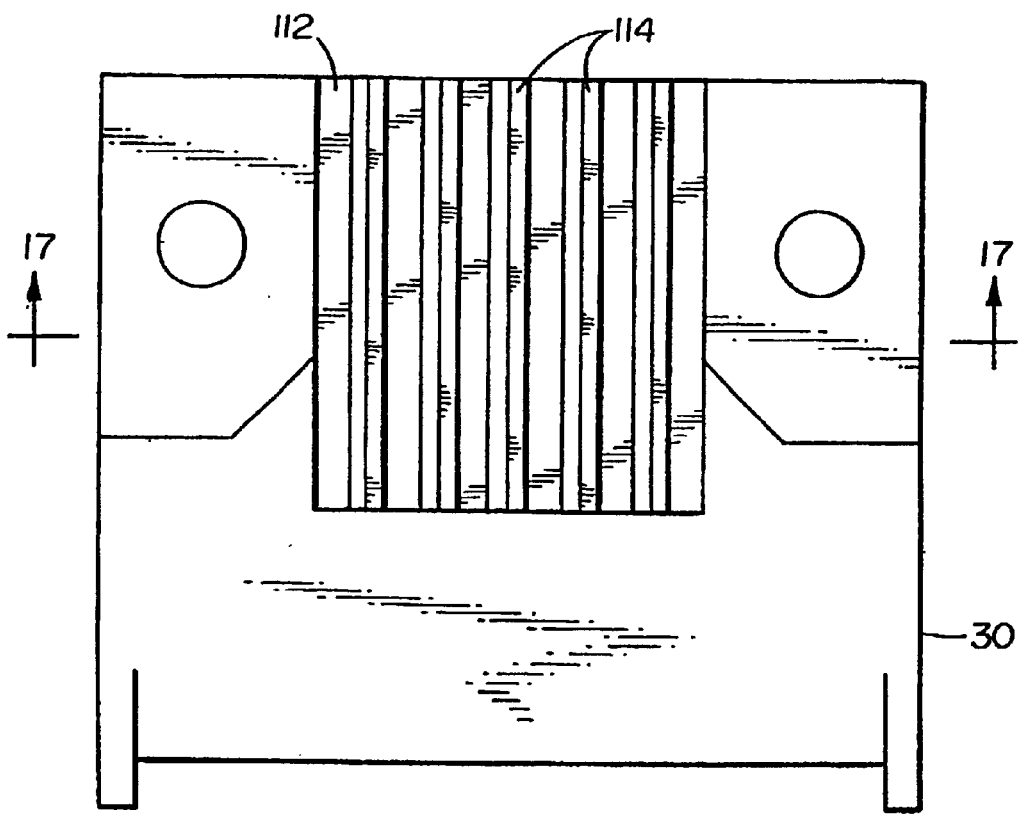
FIG. 16 is a front view of a chip carrier, showing a waffled interior.
Figure 17:
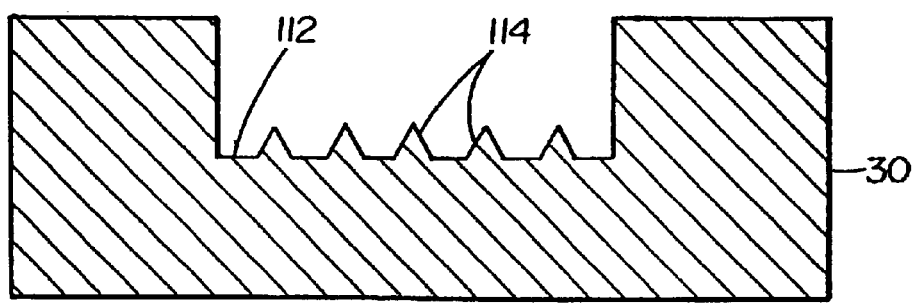
FIG. 17 is a sectional view along section A—A of FIG. 16.
Figure 18:
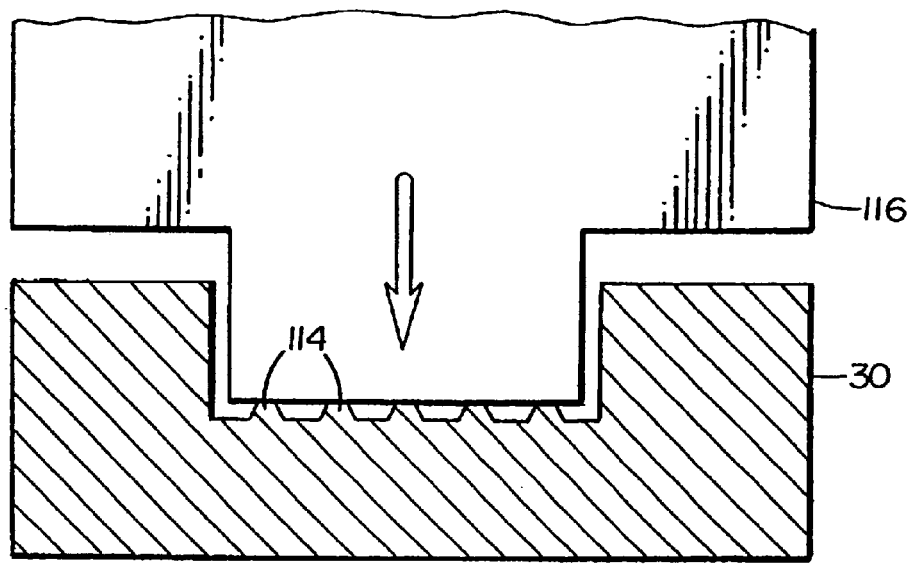
FIG. 18 shows the waffled interior of the chip carrier being planerized with a coining tool.
Figure 19:
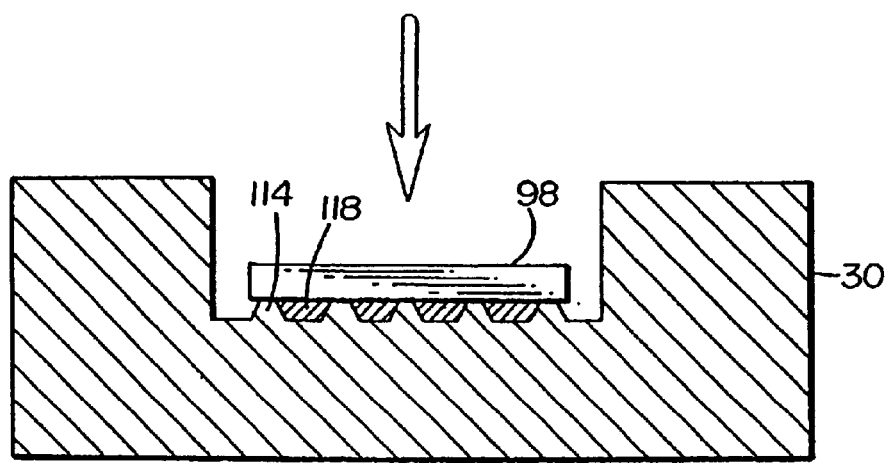
FIG. 19 shows the chip mounted in the chip carrier with thermal epoxy.

Referring to FIG. 16, it is seen that the chip carrier 30 has a plurality of ribs 114 along the interior of its rear surface 113. These may be made of the same metal as the carrier, e.g., copper. These ribs are initially pointy, as shown in the sectional view of FIG. 17. However, before the chip is placed on them, they are planarized with a coining tool 116 as shown in FIG. 18, so as to present flat surfaces to the chips. All of the ribs have the same height, thus the recesses 118 between the ribs (FIG. 19) have the same depth. As shown in FIG. 19, the recesses are filled with thermal epoxy, and the chip is placed over the ribs, where it is secured by the epoxy. The ribs create a precise depth to seat the chips relative to the back of the carrier, thus controlling the chip well height. The waffle iron effect gives the epoxy a place to flow, and controls the chip to carrier epoxy layer, preventing it from becoming too thick or too thin. The multiple carrier interfaces form a more direct heat path from chip to carrier. Also, an aggregate epoxy loaded with conducting particles could be used to further enhance the wipe process to settle the particles into the voids, resulting in a net increase in thermal conduction properties.

A further feature of the invention is shown in the embodiment of FIG. 20 which depicts a heat sink to carrier interface using stepped surfaces 120 and 122. The advantage of the stepped surfaces is that low viscosity thermal epoxy is retained during assembly, making it more difficult for it to flow freely and escape.

A further feature of the invention is a modified TAB bonding process for applying flexible leads to the GaAs optoelectronic chip. In the conventional method of applying leads, a well known TAB bonding process is used to bond to electrolytically bumped bonding pads on a chip. However, the conventional process of electrolytic bumping in a wafer is not suitable for GaAs because of its fragility.

According to the invention, bumping is performed on individual chips after being cut from the wafer. After being mounted on a substrate or heat sink, ball bumping to the aluminum chip pads is performed using a standard ball bumping process on a wire bonder. Gold wire is fed into the ceramic tip of the wire bonding tool and flameoff causes a gold bump to be formed on the conductive pad. As is known in the ball bumping process, the wire is cut after a ball is formed, so the resultant bump has the shape of a chocolate "KISS" with a little gold wire protruding from the ball. The tip is then flattened with a coining tool, and flexible lead is applied thereto by the known TAB bonding process.

According to a further feature relating to the assembly of the module, an overmold is provided which has epoxy flow control members built onto it. Referring to FIG. 21, a perspective view of overmold 300 is shown. Cavity 302 is provided which exposes laminate board 304 having electrical connections made thereto. After such connections are made, the cavity is glob-topped with epoxy, so as to make it devoid of empty space.

The overmold has on it a number of flow controlling members for ensuring that the epoxy is properly fed to the cavity, and that it remains therein. Flow initiating members 306 are inclined ramps which aid epoxy from the cavity in flowing upwards towards the chip carriers to fill the region between the chip carriers and the retainer. Flow limiting members 308 and 310 are abutments in proximity to the cavity which act as dams, preventing egress of the epoxy from the cavity. The overmold has well 312 therein in which the web of the heat sink is inserted. Flow controller member 314 is a curved abutment which partially surrounds the well and protects it from being invaded by epoxy.

The foregoing invention has been described in connection with a preferred embodiment. It should be understood that variations will occur to those skilled in the art, and the invention is defined in the following claims.

What is claimed is:

1. A chip module comprising:

a chip carrier having a metallic planar body portion and a multiplicity of metallic ridges projecting from said planar body portion, said ridges being substantially parallel with each other and having substantially the same height as each other;

a chip mounted on said multiplicity of ridges; and adhesive in valleys which lie between said ridges between said chip and said planar body portions said adhesive adhering said chip to said chip carrier; and wherein each of said ridges has a flat surface to which said chip is mounted.

2. A chip carrier comprising:

a metallic planar body portion and a multiplicity of metallic ridges projecting from said planar body portion, said ridges being substantially parallel with each other and having substantially the same height as each other, said ridges being sized and positioned to mount a chip thereon and receive an adhesive in valleys which lie between said ridges between said chip and said planar body portion, said adhesive to adhere said chip to said chip carrier; and wherein each of said ridges has a flat surface to support said chip.

* * * * *